United States Patent

Kakuta et al.

[11] Patent Number: 6,111,465
[45] Date of Patent: Aug. 29, 2000

[54] AMPLIFYING UNIT COMPRISING AN INPUT TRANSFORMER CAPABLE OF CONTRIBUTING TO A WIDER FREQUENCY BAND OF A BROADBAND AMPLIFIER

[75] Inventors: Yuji Kakuta; Yoshiaki Fukasawa; Yasuhiro Shirakawa; Yoshiaki Wakabayashi, all of Tokyo, Japan

[73] Assignee: NEC Corporation, Tokyo, Japan

[21] Appl. No.: 08/948,334

[22] Filed: Oct. 9, 1997

[30] Foreign Application Priority Data

Oct. 9, 1996  [JP]  Japan .................................... 8-268673

[51] Int. Cl.[7] .............................................. H03F 3/26
[52] U.S. Cl. ................................. 330/276; 333/26
[58] Field of Search ................................. 330/276, 165, 330/188, 171, 301; 336/180, 182, 184; 333/25; 4/26

[56] References Cited

U.S. PATENT DOCUMENTS

| | | | |
|---|---|---|---|
| 3,488,603 | 1/1970 | Rogers | 330/276 |
| 4,706,038 | 11/1987 | Navadi et al. | 330/276 |
| 4,965,526 | 10/1990 | Craft et al. | 330/66 |
| 5,060,298 | 10/1991 | Waugh et al. | 455/326 |
| 5,061,910 | 10/1991 | Bouny | 333/26 |
| 5,091,708 | 2/1992 | Bezjak | 333/26 |
| 5,142,239 | 8/1992 | Brayton et al. | 350/66 |
| 5,369,795 | 11/1994 | Yanagimoto | 455/327 |
| 5,570,062 | 10/1996 | Dent | 330/276 |
| 5,767,754 | 6/1998 | Menna | 333/25 |
| 5,886,589 | 3/1999 | Mourant | 333/26 |

FOREIGN PATENT DOCUMENTS

| | | |
|---|---|---|
| 629042 | 12/1994 | European Pat. Off. . |
| 647021 | 4/1995 | European Pat. Off. . |
| 5-199048 | 8/1993 | Japan . |
| 5-315140 | 11/1993 | Japan . |
| 6-276045 | 9/1994 | Japan . |
| 7-240652 | 9/1995 | Japan . |

OTHER PUBLICATIONS

*Patent Abstracts of Japan*, vol. 017, No. 032, Jan. 21, 1993//JP 4–253309, Sep. 1992.
*Patent Abstracts of Japan*, vol. 017, No. 075, Feb. 15, 1993//JP 4–277910, Oct. 2, 1992.
*Patent Abstracts of Japan*, vol. 010, No. 283, Sep. 26, 1986//JP 61–101109, May 20, 1986.

*Primary Examiner*—Robert Pascal
*Assistant Examiner*—Khanh Van Nguyen
*Attorney, Agent, or Firm*—Ostrolenk, Faber, Gerb & Soffen, LLP

[57] ABSTRACT

An input transformer, used as a transmission-line transformer (11), is provided for connection between an unbalanced transmission line (10) and a balanced broadband amplifier (12), in which the input transformer has a fixed middle potential. The transmission-line transformer (11) converts an input signal into two output signals having opposite phase with respect to each other and which are supplied to the broadband amplifier (12). It is therefore possible to cancel secondary distortion in an amplifying unit. As the transmission-line transformer (11) a forced-balun type transmission-line transformer is used which has two input ports (P1, P2) and three output ports (P3, P4, P5), one (P4) of which is grounded. First and second two-wire parallel lines are arranged between the input ports and the output ports via a single glasses-shaped core. The input port and the two output ports have a respective impedance ratio of $1:(\tfrac{1}{2}):(\tfrac{1}{2})$.

12 Claims, 4 Drawing Sheets

AMPLIFYING UNIT COMPRISING AN INPUT TRANSFORMER CAPABLE OF CONTRIBUTING TO A WIDER FREQUENCY BAND OF A BROADBAND AMPLIFIER

BACKGROUND OF THE INVENTION

This invention relates to an amplifying unit capable of amplifying a broadband input signal and, in particular, to an amplifying unit comprising an input transformer and a broadband amplifier.

In recent years, in the cable television (CATV) industry or the like, there is a demand to receive a lot of channels, for example, up to one hundred image channels. In compliance with the demands for a lot of channels, it is necessary to provide a broadband amplifier which is capable of amplifying an input signal uniformly and with low distortion that ranges from a low frequency of about 50 MHz to a very high frequency of about 1 GHz. In other words, to extend over a wide frequency band of about 700 MHz to 1 GHz.

Here, the amplifying unit for the CATV of the type described normally comprises not only the above-mentioned broadband amplifier but also an input transformer and an output transformer at input and output sides of the broadband amplifier in connection with impedance matching for a cable or other equipment.

In the prior art, for the amplifying unit having such a structure, miniaturization is strongly needed in a manner similar to other circuits. However, it is difficult to sufficiently miniaturize the amplifying unit. This is because the input transformer and the output transformer cannot be implemented by an integrated circuit (IC) chip. The broadband amplifier can be implemented by an IC chip and results in miniaturizing. On the other hand, inasmuch as the input transformer and the output transformer for use in the amplifying unit of the type described must have the impedance matching capability over the wider frequency band, various devices have been made therefor. However, no proposal has yet been made for a transformer which is inexpensive and which maintains an impedance match over the wide frequency band required for CATV. Accordingly, so long as a conventional proposed input transformer and output transformer are used, it is impossible to avoid impedance mismatching and it is impossible to prevent degradation of image quality due to generation of a ghost signal accompanied with generation of a reflected wave and the degradation of efficiency in transmission. In particular, the adverse affects increase even with a little impedance mismatch in the CATV supply signals to a broad area, inasmuch as the CATV comprises a lot of broadband amplifying units. As described above, the impedance matching in the input and the output transformers is a very significant problem in the amplifying unit used in CATV.

Various amplifying units of the described type are already known. By way of example, a hybrid amplifier is disclosed in U.S. Pat. No. 4,965,526 (hereinafter referred to as reference 1) issued to Scott Craft et al. on Oct. 23, 1990, which is hereby incorporated herein by reference. The hybrid amplifier of reference 1 operates in the radio frequency (RF) range of 100–1000 MHz or higher. In reference 1, active elements composing the amplifier are implemented by chips, and the chips and input and output transformers are mounted on a circuit board. In addition, symmetrical parts of the electrical circuit are arranged in a mirror symmetrical fashion. With this structure, it is possible to reduce the adverse affects of parasitics related to the electrical circuit.

Furthermore, reference 1 uses, as the input and the output transformers, magnetic coupled transformers through which connection between a transmission line and the amplifier and connection between an external circuit and the amplifier are carried out. Each magnetic coupled transformer comprises a toroidal core and a winding wound around the toroidal core. In addition, the magnetic coupled transformers are arranged on the substrate in a planar fashion and each winding of the magnetic coupled transformer has terminals which are individually connected to a metal pattern or a conductor pattern arranged on the substrate.

A high frequency linear amplifier is disclosed in U.S. Pat. No. 5,142,239 (hereinafter referred to as reference 2) issued to Daniel C. Brayton et al. on Aug. 25, 1992, which is hereby incorporated herein by reference. The high frequency linear amplifier comprises a broadband amplifier and a transmission-line transformer connecting the broadband amplifier and a transmission line. In addition, reference 2 uses a set of two-wired parallel lines having a predetermined characteristic impedance and teaches use of the transmission-line transformer. With this structure, it is possible to improve frequency characteristics compared to reference 1, and to achieve miniaturization and light weight.

A balance/unbalance converter is published in Japanese Unexamined Patent Publication of Tokkai No. Hei 7-240,652 or JP-A 7-240,652 (hereinafter referred to as reference 3) on Sep. 12, 1995, which is hereby incorporated herein by reference. The balance/unbalance converter comprises a transmission-line transformer between a balanced cable and an unbalanced cable and two resistor elements which are connected between the balanced cable in series. A middle point of the two resistor elements is grounded. With this structure, a middle potential is fixed by grounding the middle point of the two resistor elements and results in reducing the imdemence in a common mode.

However, the above-mentioned references 1 through 3 have problems described as follows. In the reference 1, the magnetic coupled transformers occupy a large area in the substrate because the magnetic coupled transformers are arranged in a planar fashion. In addition, inasmuch as each winding of the magnetic coupled transformer is wired to the conductor pattern or the metal pattern and has a long wire distance between the toroidal core and the conductor pattern, it is disadvantageous in that because a parasitic inductance changes by dispersion due to wiring, it is necessary to finely adjust after wiring, thereby degrading the frequency characteristics. After adjustment, it is necessary to fix the toroidal core and the wiring to the substrate by an adhesive such as varnish. On fixing, the float capacitance changes due to dielectric constant of the adhesive and results in the problematic shifting from an adjusted characteristic. As described above, much time is consumed in adjusting. In addition, when magnetic coupled transformers are used, a higher frequency band is restricted by a coupling coefficient between lines and a lower frequency band is restricted by the material of the core. As a result, the magnetic coupled transformer has a bad frequency characteristic and is unsuitable for the wider frequency band.

In addition, reference 2 may teach utilization of a transmission-line transformer and a two-wire parallel line, but it does not take into account the connection relationship at the input and output sides of the transmission-line transformer suitable for the broadband amplifier. Therefore, reference 2 only takes account of selection so that a ratio of input and output impedances is equal to $1:n^2$ (concretely 1:1) in a manner similar to a normal transmission line transformer. Accordingly, it is difficult for the reference 2 to realize other impedance ratios.

At any rate, when the transmission-line transformer having an impedance ratio of 1:1 is connected to the balance input of the amplifier, it is disadvantageous in that a middle point is unsettled, characteristics such as a gain characteristic of the high frequency amplifier and a characteristic of a secondary distortion are unstable. In addition, when a small-sized core is used to meet a of miniaturization requirement, a ground impedance becomes small and the adverse affects of signals of even mode (which is called common mode) are increased.

In addition, inasmuch as reference 3 also does not teach a connection relationship between the transmission-line transformer and the broadband amplifier, it is difficult for the reference 3 to determine the connection relationship between the transmission-line transformer and the broadband amplifier suitable therefor and a structure therefor. Furthermore, inasmuch as high frequency power reversed in phase 180 degrees is terminated via a terminal resistor at the output port of the transformer in the structure of reference 3, termination is made at a constant impedance under any frequency. However, it is difficult for reference 3 to fix the middle potential without changing the impedance ratio between the input side and the output side. This is because of the following reasons. When the terminal resistor has a large value, a little high frequency current flows in the terminal resistor, and it is therefore impossible to stably maintain the middle potential. When the terminal resistor has a small value, the conversion ratio varies.

SUMMARY OF THE INVENTION

It is therefore an object of this invention to provide an amplifying unit comprising an input transformer provided with a structure which is capable of contributing to a wider frequency band of a broadband amplifier.

It is another object of this invention to provide an amplifying unit of the type described, which is easily capable of taking a matching between an input side of the broadband amplifier and the input transformer.

It is still another object of this invention to provide an amplifying unit of the type described, which has superior frequency characteristics and is stable.

It is yet another object of this invention to provide an amplifying unit of the type described, which is provided with a structure capable of miniaturization.

It is a further object of this invention to provide a transmission-line transformer which is capable of realizing an impedance ratio of 1:(½):(½) and of reducing secondary distortion in a broadband amplifier.

It is still a further object of this invention to provide a transmission-line transformer of the type described, which is substantially capable of mounting on a substrate or the like with no adjustment, by reducing variation on mounting it on the substrate or the like Other objects of this invention will become clear as the description proceeds.

An amplifying unit to which this invention is applicable, comprises a balanced broadband amplifier and an input transformer connected between an unbalanced transmission line and an input of the balanced broadband amplifier. According to an aspect of this invention, the input transformer is characterized by a transmission-line transformer which includes means for determining a middle point output with a characteristic impedance of the input transformer maintained.

According to another aspect of this invention, a transmission-line transformer of a surface mounting type comprises a glasses-shaped core having two surfaces opposed to each other and a side section connecting the surfaces. The glasses-shaped core has two holes bored between the two surfaces. A surface mounting substrate fixes the glassed-shaped core by supporting the side section. Two input ports are formed in the vicinity of one of the two surfaces. First, second, and third output ports are formed in the vicinity of another of the two surfaces. Connected to the two input ports and the first and the third output port is a first two-wire parallel line which passes through one of the two holes in the glasses-shaped core. A second two-wire parallel line has an end portion connected to the first and the second output ports and another end portion connected to the third and the second output ports. The second two-wire parallel line passes through another of the two holes. The two input ports and the first through the third output ports are directly connected to the surface mounting substrate. With this structure, the transmission-line transformer is mounted on the surface mounting substrate with the two input ports turned to an input transmission line, with the first through the third output ports turned to a broadband amplifier, and with the glasses-shaped core stood up. Mounting to the surface mounting substrate and electrical connection to the broadband amplifier are easily carried out and it is possible to reduce the mounting area of the glasses-shaped core.

DESCRIPTION OF THE PREFERRED EMBODIMENTS

Figure 1:
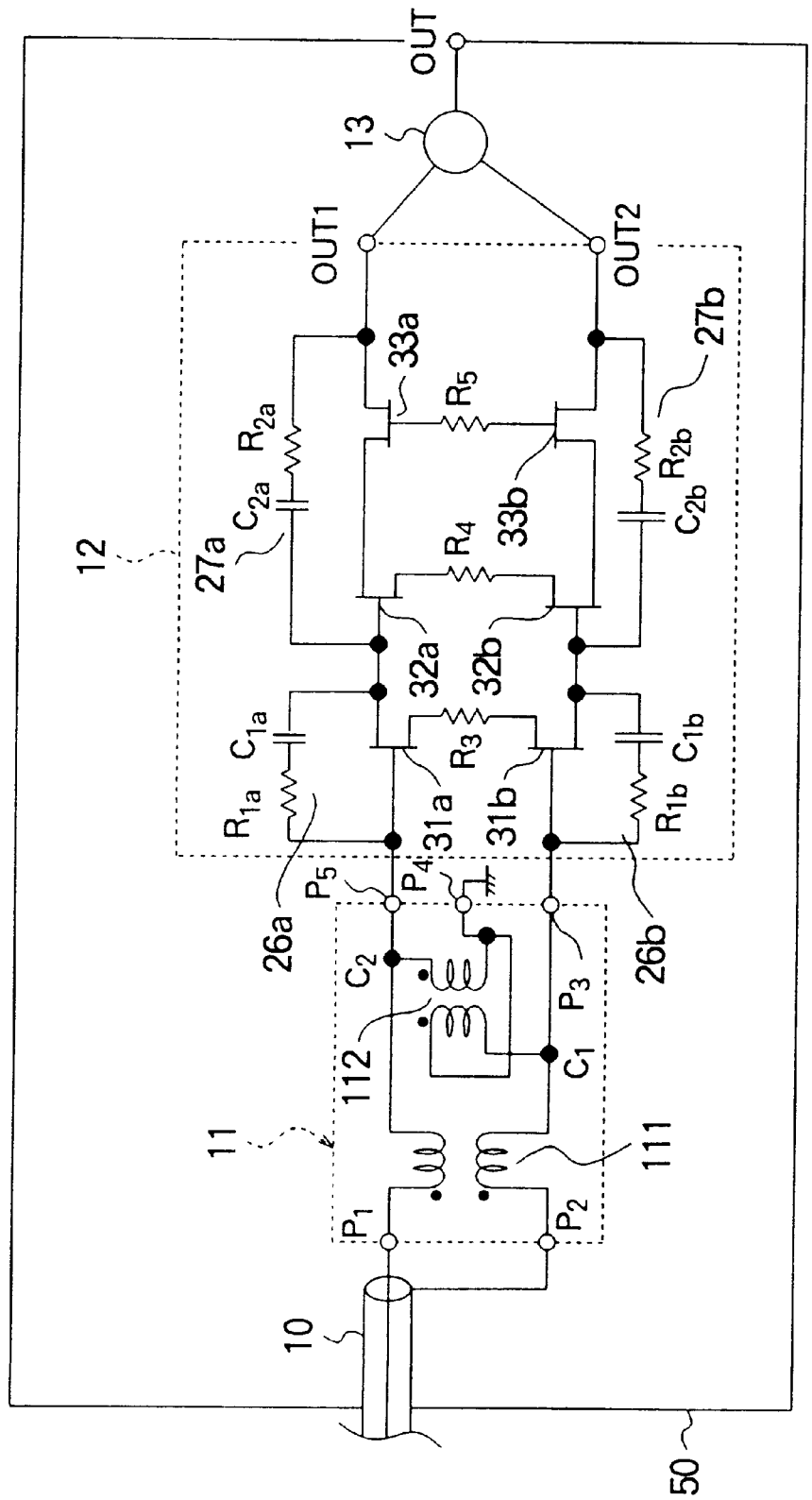
FIG. 1 is a circuit diagram for use in describing an amplifying unit according to an embodiment of this invention.

Referring to FIG. 1, an amplifying unit according to a preferred embodiment of this invention is connected to an input transmission line 10 composed of an unbalanced line such as a coaxial line. The amplifier unit amplifies a broadband high frequency signal supplied from the input transmission line 10 to produce output signals at output terminals OUT1 and OUT2.

In addition, the illustrated amplifying unit comprises an input transformer 11, a broadband amplifier 12, and a power coupler 13 which are mounted on a circuit board 50. Connected to an input side of the input transformer 11, the broadband amplifier 12 comprises a balanced broadband amplifier having an input impedance of 37.5 Ω over a frequency range of 50–800 MHz. The balanced broadband amplifier 12 is formed by first and second amplifying circuits having the same structure which are connected to each other in push-pull fashion. In addition, FIG. 1 shows an equivalent current in an alternating current and takes no thought of connection in a direct current.

The illustrated first amplifying circuit comprises FETs 31a and 32a composing a source-grounded type amplifier, and FET 33a composing a cascade-connection amplifier cascode-connected to FET 32a. Connected between a drain and a gate of FET 31a, a series circuit composed of a resistor R1a and a capacitor C1a serves as a first negative feedback circuit 26a. Connected between a drain of FET 33a and a gate of FET 32a, a series circuit composed of a capacitor C2a and a resistor R2a serves as a second negative feedback circuit 27a.

Likewise, the second amplifying circuit comprises FETs 31b to 33b, resistor R1b and a capacitor C1b acting as a first negative feedback circuit 26b, and a capacitor C2b and a resistor R2b acting as a second negative feedback circuit 27b. In addition, a resistor R3 is connected between sources of FETs 31a and 31b and a resistor R4 is connected between sources of FETs 32a and 32b. Furthermore, a resistor R5 is connected to gates of the FETs 33a and 33b. Resistors R3 and R4 are balance resistors for removing secondary distortion by imaginarily grounding the FETs which are mutually connected thereto. Resistors R5 is a bias resistor for supplying a bias voltage from a bias source (not shown) to be stable for gate-grounded operation. The balanced broadband amplifier 12 having this structure is advantageous in that a difference does not occur at the output although characteristics of the FETs change or there is a difference lies in the amplitude of input signals at a 180 degree phase difference. Also it is possible to cancel the secondary distortion generated by the first and the second amplifying circuits. But, inasmuch as the secondary distortion becomes larger when there is a difference in the amplitude of the input signals at a 180 degree phase difference when compared with the case of no difference, it is desirable to have no difference.

Connected to the input side of the above-mentioned balanced broadband amplifier 12, the input transformer 11 is composed of a transmission-line transformer including two-wire parallel lines. In the example being illustrated, a forced-balun type transmission-line transformer is used as the transmission-line transformer. More specifically, the forced-balun type transmission-line transformer 11 comprises input ports P1 and P2 connected to the input transmission line 10 and output ports P3 to P5 wherein the output ports P3 and P5 are connected to input terminals of the balanced broadband amplifier 12 and the output port P4 is grounded. It is assumed that an input impedance between the input ports P1 and P2 is represented by Zin, an output impedance between the output ports P3 and P4 is represented by Zout1, an output impedance between the output ports P5 and P4 is represented by Zout2, and an output impedance between the output ports P3 and P5 is represented by Zout.

The forced-balun type transmission-line transformer 11 comprises first and second two-wire parallel lines 111 and 112 each comprising two transmission lines which are arranged in parallel and which are fixed to each other by a coating or the like. The transmission lines of the first two-wire parallel line 111 have input terminals connected to the input ports P1 and P2 while the transmission lines of the first two-wire parallel line 111 have output terminals connected to common connection points C1 and C2 in the second two-wire parallel line 112. The transmission lines composing the first two-wire parallel line 111 serve as a transmission transformer.

One transmission line in the second two-wire parallel line 112 has an end which is connected to the common connection point C1 and to the output port P3 and has another end or a winding start end which is grounded via the output port P4. In addition, another transmission line in the second two-wire parallel line 112 has an end or a winding start end which is connected to the output port P5 via the common connection point C2 and another end which is grounded via the output port P4. As described above, the second two-wire parallel line 112 of the illustrated forced-balun type transmission-line transformer 11 has a middle point which is fixed by grounding in an alternating current fashion. Inasmuch as the middle point is fixed, it is possible to give full play to the characteristic of the balanced broadband amplifier 12.

The first two-wire parallel line 111 is wound around a ring-shaped core (not shown) to form a first transmission-line transformer, while the second two-wire parallel line 112 is wound around a ring-shaped core (not shown) to form a second transmission-line transformer.

With this structure, formed in the input side of the forced-balun transmission-line transformer 11, the first transmission-line transformer converts an unbalanced input high frequency signal from the transmission line 10 into a balanced input high frequency signal to produce the balanced input high frequency signal. The first transmission-line transformer has an input/output impedance ratio of 1:1 and is adjusted so that the input impedance between the input ports P1 and P2 is 75 Ω.

Formed in the output side of the forced-balun transmission-line transformer 11, the second transmission-line transformer is a balanced-type, is connected to the output terminals of the transmission line 10, namely, the common connection terminals Cl and C2, and determines a middle potential of a balanced output. The second transmission-line transformer is adjusted so that each of the output impedance Zout1 between the output ports P3 and P4 and the output impedance Zout2 between the output ports P5 and P4 has 37.5 Ω and the impedance ratio therebetween is 1:1. It is apparent that the illustrated forced-balun transmission-line transformer 11 has an impedance ratio (Zin:Zout1:Zout2) of 1:(½):(½).

Description will be made about operation of the amplifying unit illustrated in FIG. 1. The input high frequency signal from the transmission line 10 is supplied between the input ports P1 and P2 of the forced-balun transmission-line transformer 11. The input high frequency signal is produced as balanced signals at the output ports P5 and P3. More specifically, an output signal having the same phase to the input high frequency signal is sent between the output ports P5 and P4 while another output signal having an inverted phase to the input high frequency signal is sent between the output ports P3 and P4. The output signals sent to the output ports P5 and P3 have the same amplitude and opposite phase to each other.

As described above, it is possible for the forced-balun type transmission-line transformer 11 determining the middle point to supply the output signals with little voltage difference at the output ports P3 and P5 over a wide frequency band and to send the output signals which are not shifted in the phase difference from 180 degrees largely. Inasmuch as the balanced broadband amplifier 12 has a fixed middle point at its input side by combining such a forced-balun type transmission-line transformer 11 with the balanced broadband amplifier 12, it is possible to make the balanced broadband amplifier 12 achieve a sufficient gain characteristic and a sufficient secondary distortion characteristic. This implies that it is possible to drastically improve the secondary distortion in the whole amplifying unit. In particular, inasmuch as the output signals supplied from the forced-balun type transmission-line transformer to the balanced broadband amplifier 12 have the same amplitude and the opposite phase, the output signals are amplified in the balanced broadband amplifier 12 with the same amplitude and the opposite phase, and combined by the power coupler 13 to produce an output at the output terminal OUT. On the other hand, inasmuch as the secondary distortion generated in the balanced broadband amplifier 12 has the same amplitude and the same phase, it is mutually canceled by the power coupler 13. If any difference lies in the amplitude of the secondary distortion or if a phase is shifted from the same phase, a coupling loss occurs in the power coupler 13, amplification efficiency is degraded, and it is therefore impossible to effectively cancel the secondary distortion. That is, inasmuch as it is possible for this embodiment to make the input of the balanced broadband amplifier 12 the same amplitude and the opposite phase, the amplification efficiency of the amplifier can be maximized and the secondary distortion can be minimized.

Figure 2:
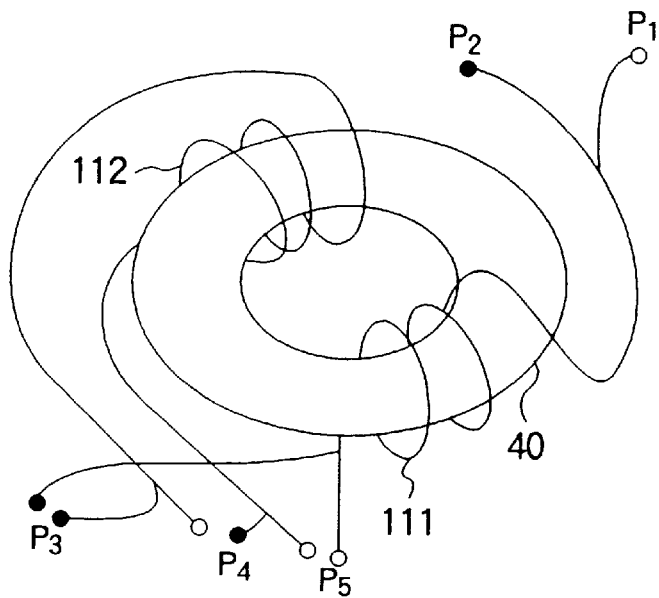
FIG. 2 is a perspective view of a forced-balun type transmission-line transformer for use in the amplifying unit illustrated in FIG. 1.

FIG. 2 shows an example of the forced-balun type transmission-line transformer which can be used as the input transformer 11 illustrated in FIG. 1. The forced-balun type transmission-line transformer comprises the above-mentioned first and second two-wire parallel lines 111 and 112 and a ring-shaped core 40 around which the first and the second two-wire parallel lines 111 and 112 are wound.

More specifically, ports P1 to P5 in FIG. 2 correspond to the ports P1 to P5 illustrated in FIG. 1. The first two-wire parallel line 111 is wound around a part of the ring-shaped core 40. As illustrated in FIG. 2, the first two-wire parallel line 111 has two winding start terminals which are connected to the input ports P1 and P2, respectively. The first two-wire parallel line 111 has two winding end terminals which are connected to the output ports P3 and P5, respectively.

On the other hand, the second two-wire parallel line 112 is wound around the ring-shaped core 40 at a portion apart from the first two-wire parallel line 111. The second two-wire parallel line 112 comprises the two transmission lines wherein one of the two transmission lines has a winding start terminal (white circle) connected to the output port P5 and other of the two transmission lines has a winding start terminal (black circle) connected to the output port P4. In addition, the one of the two transmission lines has a winding end terminal (white circle) connected to the output port P4 while the other of the two transmission lines has a winding end terminal (black circle) connected to the output port P3. With this connection relationship, it is possible to compose the forced-balun transmission-line transformer illustrated in FIG. 1. By winding the first and the second two-wire parallel lines 111 and 112 to the single core 40 at different positions in such as manner, it is possible to compose the forced-balun type transmission-line transformer with a smaller size and a narrower mounting area compared to the case where the first and the second two-wire parallel lines are wound around two ring-shaped cores, individually.

As a modification of FIG. 2, the first and the second two-wire parallel lines may be wound around the ring-shaped core at the same location with one over the other. However, with this structure, inasmuch as the first and the second two-wire parallel lines wound electro-magnetically couple with each other, there is the possibility that an impedance conversion ratio varies with winding, and processing in the terminals of each parallel line is complicated. In addition, in a case where loss at a low frequency is neglected, the first and the second two-wire parallel lines may be wound around a rod-shaped core and it results in composing the forced-balun type transmission-line transformer which can be represented by the equivalent circuit as shown in FIG. 1.

Figures 3A, 3B:
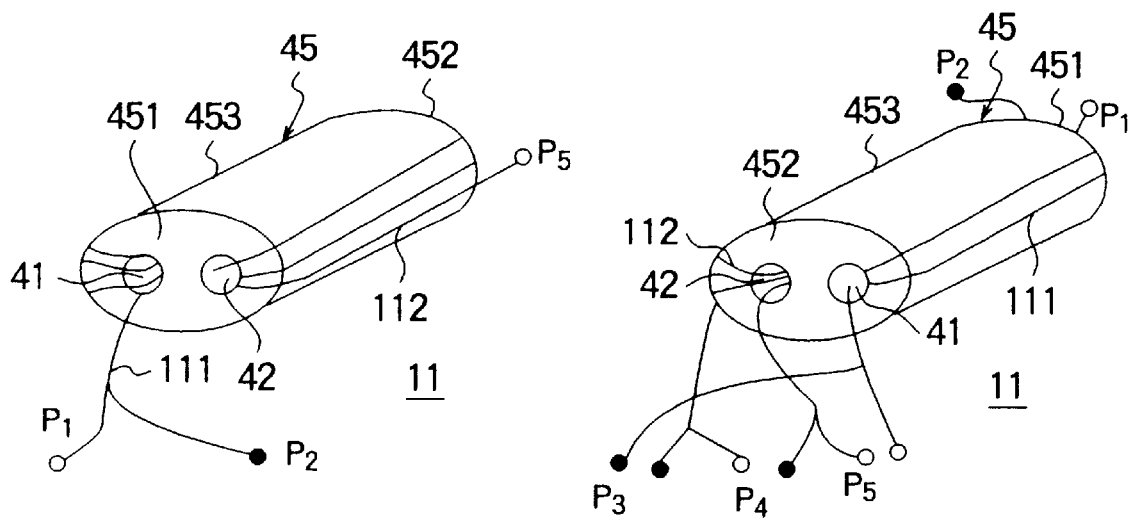
FIGS. 3A and 3B are perspective views of another forced-balun type transmission-line transformer for use in the amplifying unit illustrated in FIG. 1.

FIGS. 3A and 3B schematically show a structure of the forced-balun type transmission-line transformer 11 which is most suitable for the broadband amplifier 12 illustrated in FIG. 1. FIG. 3A is a schematic perspective view of the above-mentioned forced-balun type transmission-line transformer 11 as seen from input ports P1 and P2 side while FIG. 3B is a schematic perspective view of the above-mentioned forced-balun type transmission-line transformer 11 as seen from the output ports P3 to P5 side.

As shown in FIGS. 3A and 3B, the forced-balun type transmission-line transformer 11 comprises a glasses-shaped core 45 having first and second holes 41 and 42 which extend in parallel. As shown in FIG. 3A, the glasses-shaped core 45 has a flat front surface 451, a flat back surface 452 opposed to the front surface 451, and an oval-shaped side section 453 connecting between both surfaces 451 and 452. The above-mentioned first and second holes 41 and 42 extend between both surfaces 451 and 452.

As is apparent from FIGS. 3A and 3B, the input ports P1 and P2 are arranged at the front surface 451 side while the output ports P3 to P5 are arranged at the back surface 452 side. As shown in FIG. 3A, the two transmission lines of the first two-wire parallel line 111 have winding start portions connected to the input ports P1 and P2 and pass through the first hole 41. After passing through, the two transmission lines of the first two-wire parallel line 111 have winding end portions connected to the output ports P3 and P5 as shown in FIG. 3B. In FIGS. 3A and 3B, the two transmission lines composing the first two-wire parallel line 111 are distinguished by white circle and black circle. The first two-wire parallel line 111 may pass through the first hole 41 by at least one turn. Alternatively, as shown in FIGS. 3A and 3B, after passing through the first hole 41, the first two-wire parallel line 111 may be wound around the glasses-type core 45 by plural turns (two turns in figures).

On the other hand, the second two-wire parallel line 112 passes through the second hole 42 and is connected to the output ports P3 to P5 in connection relationship illustrated in FIG. 1. More specifically, one transmission line (white circle) of the second two-wire parallel line 112 has a winding start portion connected to the output port P5 and a winding end portion connected to the output port P4. In addition, another transmission line (black circle) of the second two-wire parallel line 112 has a winding start portion connected to the output port P4 and a winding end portion connected to the output port P3. The second two-wire parallel line 112 may pass through by at least one turn. As shown in FIGS. 3A and 3B, the second two-wire parallel line 112 may be wound around the glasses-shaped core 45 by plural turns (three times in figures). When the second two-wire parallel line 112 is wound around the glasses-shaped core 45, it is desirable that the second two-wire parallel line 112 is wound so as to be not overlapped with the first two-wire parallel line 111. As shown in FIGS. 3A and 3B, it is favorable that the first and the second two-wire parallel lines 111 and 112 are wound so as to pass through the glasses-shaped core 45 at opposed side faces.

Inasmuch as the output port P4 is grounded, it is clear that the forced-balun type transmission-line transformer 11 illustrated in FIGS. 3A and 3B is represented by the equivalent circuit as shown in FIG. 1.

Figure 4:
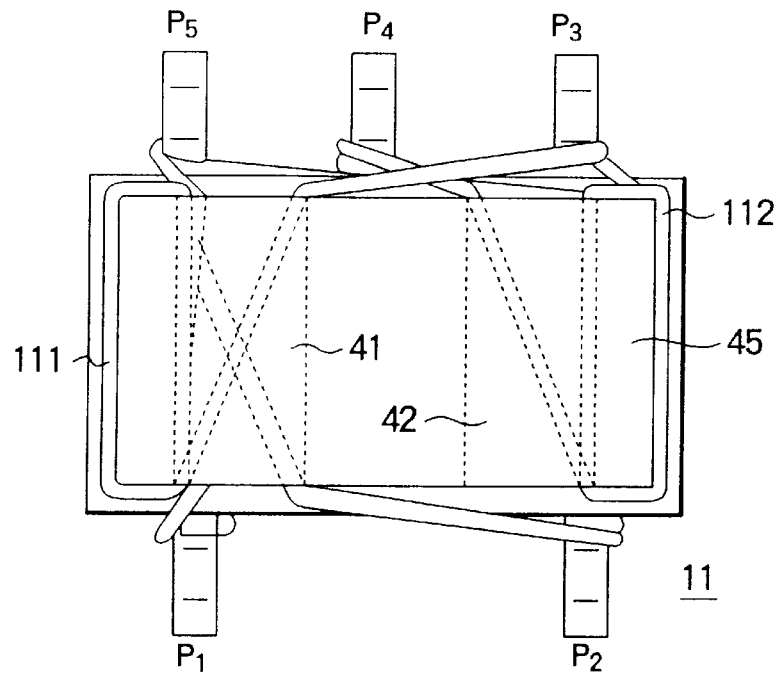
FIG. 4 is a plan view for use in describing the forced-balun type transmission-line transformer illustrated in FIG. 3 in detail.
Figure 5:
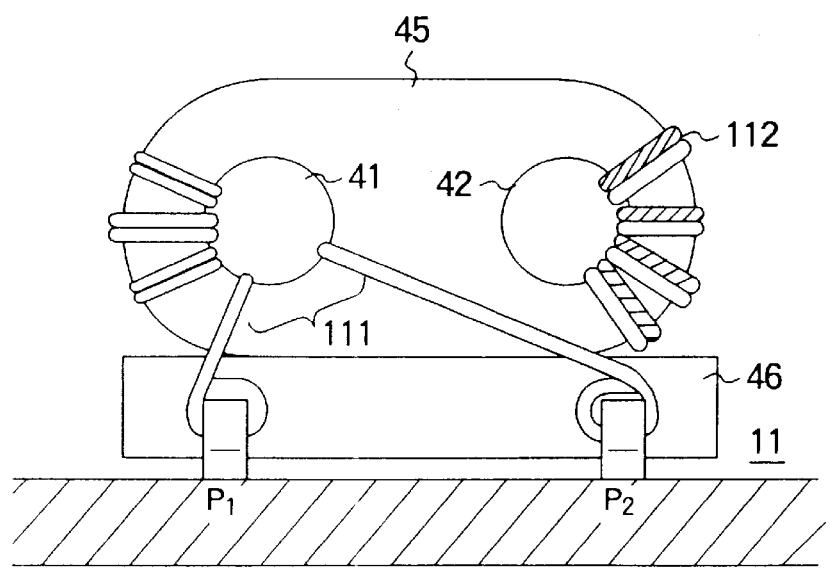
FIG. 5 is an elevation view of the forced-balun type transmission-line transformer illustrated in FIG. 4.
Figure 6:
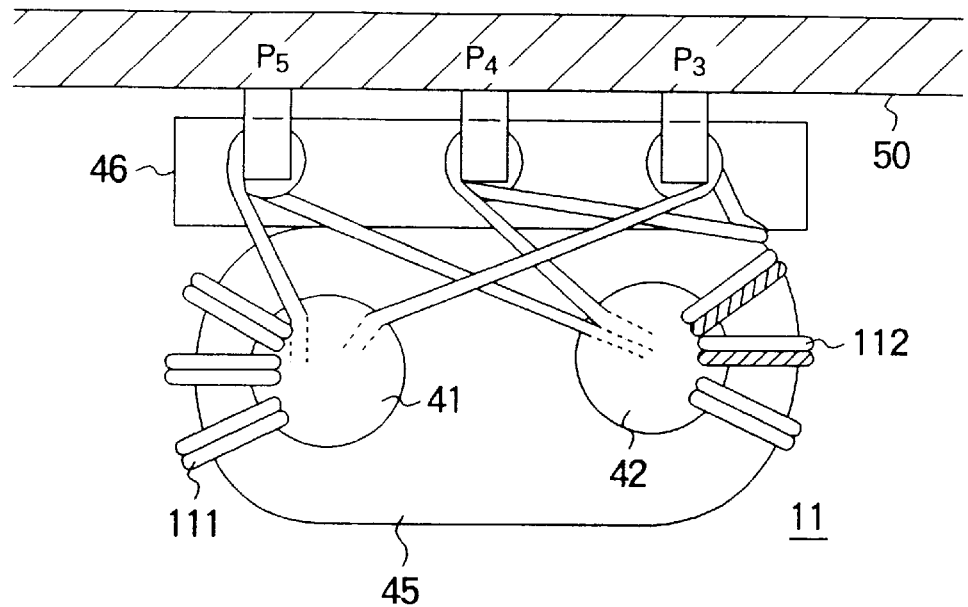
FIG. 6 is a rear view of the forced-balun type transmission-line transformer illustrated in FIG. 4.
Figure 7:
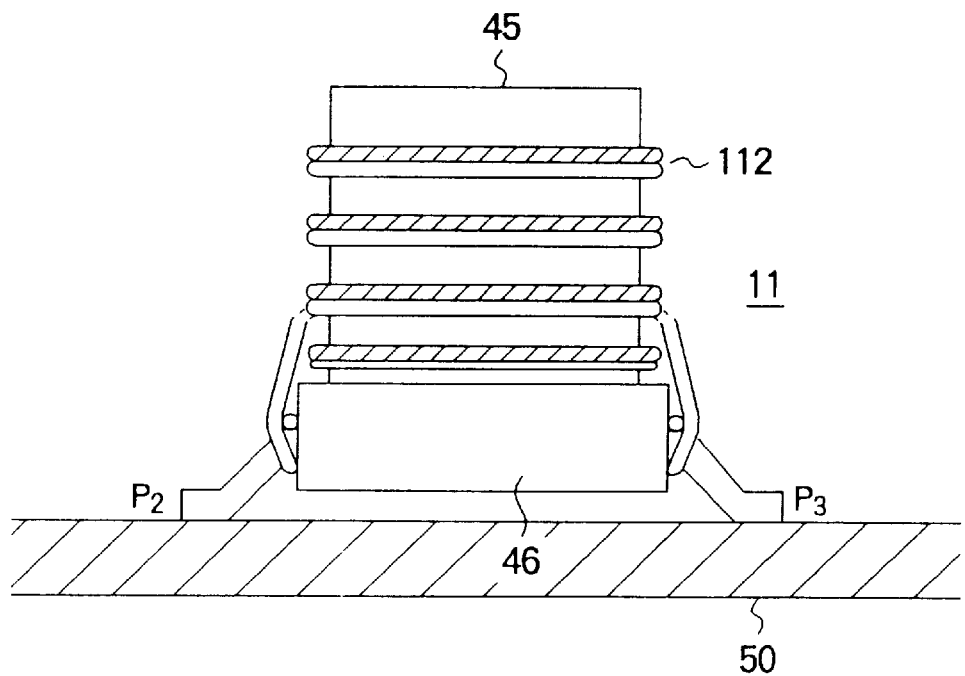
FIG. 7 is a lateral view of the forced-balun type transmission-line transformer illustrated in FIG. 4.

Referring to FIGS. 4, 5, 6, and 7, description will be made of an example where the forced-balun type transmission-line transformer 11 illustrated in FIGS. 3A and 3B is implemented by a surface mounting type element. FIGS. 4 through 7 are a plan view, an elevation view, a rear view, and a lateral view of the forced-balun type transmission-line transformer 11 implemented by the surface mounting type element. As apparent from FIGS. 5 to 7, the illustrated force-balun transmission-line transformer 11 comprises a surface mounting substrate 46 of a rectangular shape. Surface mounting substrate 46 has one side to which the input ports P1 and P2 are attached (FIGS. 4, 5, and 7) and another side to which the output ports P3 to P5 are attached (FIGS. 4, 6, and 7). The illustrated glasses-shaped core 45 has a width wider than a length between the front surface and the back surface. Actually, the glasses-shaped core 45 has the length of about 3 mm and the width of about 5 mm. The glasses-shaped core 45 is fixed to the surface mounting substrate 46 and results in composing the surface mounting type element. As is apparent from FIGS. 4, 5, and 6, the first two-wire parallel line 111 is electrically connected to the input ports P1 and P2, passes through the first hole 41 of the glasses-shaped core 45, is thereafter wound around the glasses-shaped core 45 by three turns, and its end portions are electrically connected to output ports P3 and P5. In addition, the winding start terminals of the second two-wire parallel line 112 are electrically connected to the output ports P4 and P5, the winding end terminals of the second two-wire parallel line 112 are electrically connected to output ports P3 and P4, and wiring as shown in FIG. 1 is carried out. Output port P4 is grounded in an alternating current fashion. When the port P4 is connected to a bias source (not shown), a bias voltage is supplied to an input terminal of the balanced broadband amplifier 12.

With this structure, when the input ports P1 and P2 are supplied with the unbalanced input signal, the unbalanced input signal is converted into balanced signals by the transmission lines of the first and the second two-wire parallel lines 111 and 112. In this event, in the manner described in conjunction with FIG. 1, an in-phase signal in relation to the input signal is produced between output ports P5 and P4 while an anti-phase signal in relation to the input signal is produced between the output ports P3 and P4.

Inasmuch as one transmission line composing the the second two-wire parallel line 112 is grounded, it is possible to make impedances of the output terminals of the second two-wire parallel line 112 equal to each other as seen from a grounding terminal under any circumstances. In the characteristics of the forced-balun type transmission-line transformer illustrated in FIGS. 4 through 7, the impedance between input ports PI and P2 and the impedance between output ports P3 and P5 is equal to 75 Ω while each of the impedance between the output ports P3 and P4 and the impedance between the output ports P4 and P5 is equal to 37.5 Ω.

In the forced-balun type transmission-line transformer, inasmuch as input ports P1 and P2 are arranged at one side while output ports P3 to P5 are arranged at another side, forced-balun type transmission-line transformer 11 is mounted with the input ports P1 and P2 turned to input transmission line 10 and with the output ports P3 to P5 turned to the input terminals of the broadband amplifier 12 and therefore connection of the input/output is made extremely easy. In addition, inasmuch as the forced-balun type transmission-line transformer 11 is mounted on the circuit board 50 with the two holes of the glasses-shaped core 45 put in parallel with the circuit board 50 or with the glasses-shaped core 45 stood up, it is possible to reduce a mounting area of the transformer in the circuit board 50.

When the forced-balun type transmission-line transformer 11 illustrated in FIGS. 4 to 7 is combined with the broadband amplifier 12 illustrated in FIG. 1, it is possible to actually obtain a uniform gain over a frequency range of 10 MHz–1 GHz although inductance in the transformer 11 changes.

The description will be directed to a concrete example of the forced-balun type transmission-line transformer using the above-mentioned glasses-shaped core 45. As the glasses-shaped core 45 a core made of material of nickel ferrite is used having a length of 3 mm, a height of 2.8 mm, and a width of 5.2 mm. Each hole of the core 45 has a diameter of 1 mm and a distance between the holes is about 1.33 mm. Each transmission line composing the first and the second two-wire parallel lines 111 and 112 comprises a copper line having a thickness of 0.12 mm with the copper line coated with polyurethane resin having a thickness of 0.01 mm. The illustrated transformer is obtained by winding the first two-wire parallel line 111 around the core 45 by four turns and by winding the second two-wire parallel line 112 around the core 45 by four and a half turns. The input impedance Zin is equal to 75 Ω while the output impedances Zout1 and Zout2 are a range of 38.3–44Ω. Although the impedance ratio is theoretically 1:0.5, it is actually 1:0.51–0.59 due to the loss of the core 45 or the like.

It is possible to fix the middle potential of the output of the transmission-line transformer and to transmit the signals having the same amplitude and the opposite phase to the input of the broadband amplifier by connecting the transmission line with the input of the balanced broadband amplifier using the forced-balun type transmission-line transformer. As a result, it is possible to take signals having the same amplitude and the opposite phase out of the outputs of the broadband amplifier and it is possible to effectively amplify the signal without loss of power in the power coupler. Inasmuch as the secondary distortion generated in the broadband amplifier is amplified with the same amplitude and in-phase, it is possible to cancel and decrease the secondary distortion in the power coupler. As described above, by combining the forced-balun type transmission-line transformer with the balanced broadband amplifier, it is possible to sufficiently exhibit the characteristics of the balanced broadband amplifier.

In addition, it is possible to realize the impedance ratio of $1:(\frac{1}{2}):(\frac{1}{2})$ by adopting, as the force-balun type transmission-line transformer, a structure wherein the first and the second two-wire parallel lines are wound around the single glasses-shaped core. Inasmuch as the forced-balun type transmission-line transformer is assembled on the surface mounting substrate, it is possible to fix the wire and the core to the circuit board. Inasmuch as the forced-balun type transmission-line transformer is mounted with each port P1 to P5 directly mounted on the circuit board or the like, it is not necessary to wire wiring composing the forced-balun type transmission-line transformer. Accordingly, it is possible to prevent variation in impedance caused by wiring and it is possible to obtain the forced-balun type transmission-line transformer having a complete characteristic without adjustment. In addition, it is advantageous in that miniaturization and lightweight construction are accomplished because two transmission-line transformers are incorporated in the single core. Although the forced-balun type transmission-line transformer is mounted to the circuit board, position of winding is not changed. Prior to mounting to the circuit board, tests, adjustments, and sorting are carried out for the transmission-line transformer itself and it is not necessary to adjust after mounting. This means that it is possible to drastically reduce adjustment time and the man-hours need for adjustment and it is possible to easily carry out automatic assembly and automatic tests. This is because it is not necessary to adjust a fixed condition of the core and the position of the windings, individually, on mounting to the circuit board.

While this invention has been described in conjunction with a few preferred embodiments thereof, it will now be readily possible for those skilled in the art to put this invention into practice in various other manners.

What is claimed is:

1. An amplifying unit comprising:
   an input transformer: and
   a balanced broadband amplifier; wherein:
   said input transformer comprises a transmission-line transformer, said transmission-line transformer having a ground terminal serving as a fixed potential reference for determining a middle point output of said input transformer, whereby a characteristic impedance of said input transformer can be maintained;
   said transmission-line transformer comprises a forced-balun type transmission-line transformer; and
   wherein said forced-balun type transmission-line transformer has two input ports and first and second output ports, a first impedance between said input ports, a second impedance between said first output port and said ground terminal, and a third impedance between said second output port and said ground terminal, said first, second and third impedances being represented by Zin, Zout1, and Zout2. respectively, an impedance ratio of Zin:Zout1:Zout2 being about equal to $1:(\frac{1}{2}):(\frac{1}{2})$.

2. A transmission-line transformer comprising:
   two input ports; and
   first, second, and third output ports;
   the transmission-line transformer comprising a glasses-shaped core having two holes and a connector which connects the second output port with a fixed potential, the glasses-shaped core being arranged with a transmission line so that a ratio of a first impedance between the input ports, a second impedance between the first and the second output ports, and a third impedance between the third and the second output ports has an impedance ratio of about $1:(\frac{1}{2}):(\frac{1}{2})$.

3. A transmission-line transformer as claimed in claim 2, wherein said transmission-line transformer is formed on a surface mounting substrate.

4. A transmission-line transformer comprising:
   a glasses-shaped core having first and second holes;
   two input ports;
   first, second, and third output ports;
   a first two-wire parallel line wound through the first hole at least one turn; and
   a second two-wire parallel line wound through the second hole at least one turn,
   said first two-wire parallel line having winding start terminals connected to said two input ports and winding end terminals connected to said first and said third output ports,
   said second two-wire parallel line having a winding start terminal connected to said first output port and a winding end terminal connected to said second output port, and
   said second two-wire parallel line having another winding start terminal connected to said second output port and another winding end terminal connected to said third output port.

5. A transmission-line transformer as claimed in claim 4, wherein said transmission-line transformer is formed on a surface mounting substrate.

6. A transmission-line transformer comprising:
   a glasses-shaped core having two surfaces opposed to each other and a side section connecting the surfaces, the glasses-shaped core having two holes bored between the two surfaces;
   a surface mounting substrate for fixing the glasses-shaped core by supporting the side section;
   two input ports formed in the vicinity of one of the two surfaces;
   first, second, and third output ports formed in the vicinity of another of the two surfaces;
   a first two-wire parallel line, connected to the two input ports and the first and the third output ports, the first two-wire parallel line wound through one of the two holes in the glasses-shaped core; and
   a second two-wire parallel line having an end portion connected to the first and the second output ports and another end portion connected to the third and the second output ports, the second two-wire parallel line wound through another of the two holes;
   where the two input ports and the first through third output ports are directly connected to a circuit board.

7. A transmission line transformer as claimed in claim 6, wherein the second output port is put into a fixed potential.

8. An amplifying unit comprising a transmission-line transformer and a balanced broadband amplifier, the transmission-line transformer comprising:
   a glasses-shaped core having two surfaces opposed to each other and a side section connecting the surfaces, the glasses-shaped core having two holes bored between the two surfaces;
   a surface mounting substrate for fixing the glasses-shaped core by supporting the side section;
   two input ports formed in the vicinity of one of the two surfaces;
   first, second, and third output ports formed in the vicinity of another of the two surfaces;
   a first two-wire parallel line, connected to the two input ports and the first and the third output ports, the first two-wire parallel line wound through one of the two holes in the glasses-shaped core; and
   a second two-wire parallel line having an end portion connected to the first and the second output ports and another end portion connected to the third and the second output ports, the second two-wire parallel line wound through another of the two holes, the two input ports and the first through third output ports being directly connected to a circuit board;
   the balanced broadband amplifier having input terminals connected to the first and the third output ports of the transmission-line transformer, the transmission-line transformer and the balanced broadband amplifier being mounted on the circuit board.

9. An amplifying unit for amplifying an input signal, said amplifying unit including an input transformer coupled to a broadband amplifier, said input transformer comprising:
   a first transformer having a first winding and a second winding;
   a second transformer having a third winding and a fourth winding;
   each of said windings having a first and a second end; wherein said first ends of said first and second windings are effective to receive said input signal;

said second end of said first winding is coupled to said first end of said fourth winding;

said second end of said second winding is coupled to said second end of said third winding; and said second end of said fourth winding and said first end of said second winding are coupled to a reference potential.

10. The amplifying unit as claimed in claim 9, wherein said reference potential is a ground potential.

11. The amplifying unit as claimed in claim 9, further comprising:

a glasses-shaped core having a first and second opening extending therethrough; and said first transformer being wound through said first opening and said second transformer being wound through said second opening.

12. The amplifying unit as claimed in claim 9, wherein said transformers are wound around a ring-shaped core.

* * * * *